United States Patent
Kizaki et al.

[11] Patent Number: 5,841,217
[45] Date of Patent: Nov. 24, 1998

[54] SURFACE MOUNTING CRYSTAL UNIT

[75] Inventors: Shigeru Kizaki, Hanno; Yoshikazu Sakaguchi, Niiza; Hachiro Kimura; Kazuo Murata, both of Sayama; Issei Nakayama, Tokorozawa; Takamasa Tanaka, Nagano; Toshihide Ohi, Saku, all of Japan

[73] Assignee: Citizen Watch Co., Ltd., Tokyo, Japan

[21] Appl. No.: 815,710

[22] Filed: Mar. 12, 1997

[30] Foreign Application Priority Data

Mar. 14, 1996 [JP] Japan ................................ 8-056596

[51] Int. Cl.$^6$ ........................................ H01L 41/08
[52] U.S. Cl. .................. 310/348; 310/344; 310/345; 310/365
[58] Field of Search .................... 310/340, 367, 310/344–346, 365, 366, 348

[56] References Cited

U.S. PATENT DOCUMENTS

| | | | |
|---|---|---|---|
| 4,703,218 | 10/1987 | Takahashi et al. | 310/348 |
| 5,064,782 | 11/1991 | Nishiguchi | 437/216 |
| 5,185,550 | 2/1993 | Morita et al. | 310/344 |
| 5,250,870 | 10/1993 | Fenlon et al. | 310/345 |
| 5,373,269 | 12/1994 | Kaida et al. | 310/348 X |
| 5,382,929 | 1/1995 | Inao et al. | 310/344 X |
| 5,430,345 | 7/1995 | Takahashi et al. | 310/348 |
| 5,449,965 | 9/1995 | Tsuru | 310/367 X |
| 5,473,216 | 12/1995 | Brosig et al. | 310/346 |
| 5,585,687 | 12/1996 | Wakabayashi et al. | 310/366 |

FOREIGN PATENT DOCUMENTS

| | | | |
|---|---|---|---|
| 0019214 | 1/1986 | Japan | 310/365 |
| 2029092 | 3/1980 | United Kingdom | 310/344 |
| WO 95/15013 | 6/1995 | WIPO . | |

*Primary Examiner*—Mark O. Budd
*Attorney, Agent, or Firm*—Armstrong, Westerman, Hattori, McLeland, & Naughton

[57] ABSTRACT

In a surface mounting crystal unit comprising a quartz plate, a receptacle-like terminal member holding the quartz plate therein in such a way as to enable it to oscillate, and a lid covering an opening of the terminal member, the quartz plate is prepared in the shape of a rectangular parallelepiped and disposed such that one or both of shorter sides of the quartz plate at its both ends can be fixedly attached to flat surface portions of the terminal member with an electrically conductive adhesive of high plasticity so that the impact of a drop is buffered by the adhesive. A likelihood of any leakage is minimized by airtight bonding of the lid to the opening of the terminal member with an inorganic material such as a solder, and the like. Furthermore, crystal impedance is lowered by producing a vacuum inside the terminal member airtightly bonded by the lid.

11 Claims, 12 Drawing Sheets

FIG.5
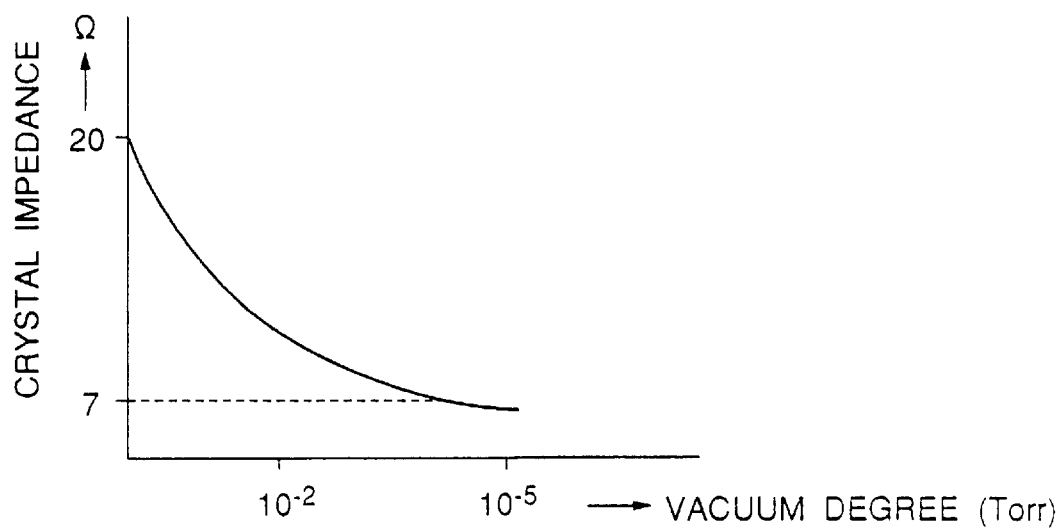
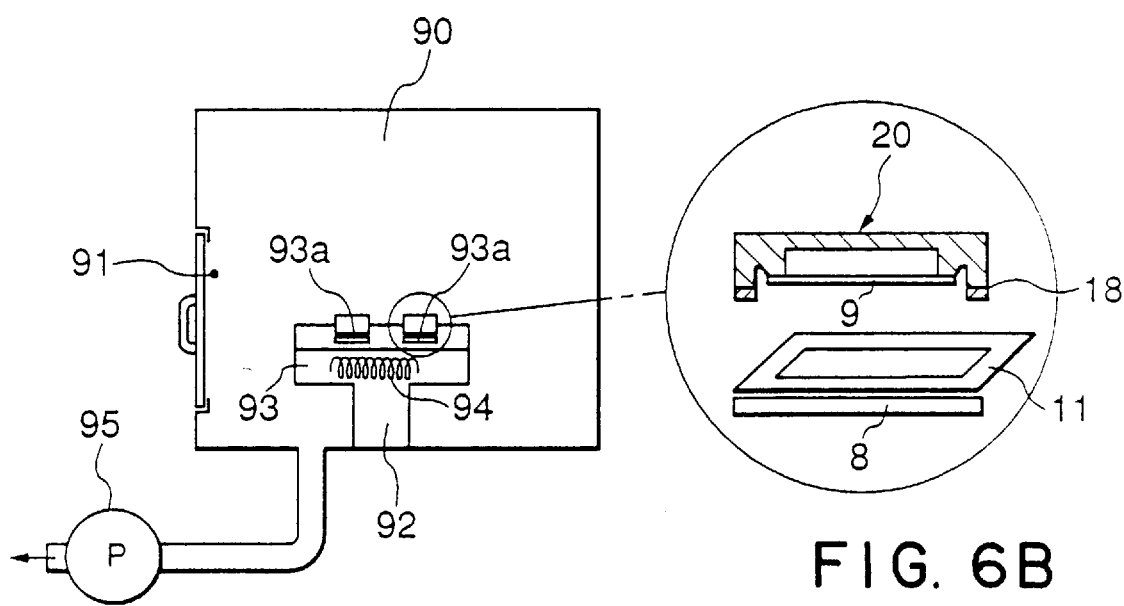
FIG. 6A
FIG. 6B

SURFACE MOUNTING CRYSTAL UNIT

BACKGROUND OF THE INVENTION

1. Field of the Invention

This invention relates to a crystal unit indispensable for mobile communication equipment such as a cellular phone, pager, and the like as a frequency standard source, and more particularly to a high precision surface-mounting type crystal unit having low equivalent resistance in series, excellent long term stability in oscillation frequency, reflow resistance, and impact resistance, and yet suited for fabrication in a compact and thin structure.

2. Description of the Related Art

A high precision temperature compensated crystal oscillator (referred to hereinafter as "TCXO") is used as a frequency standard source for mobile communication equipment such as a cellular phone, pager, and the like.

As the industry has been aiming at smaller and thinner mobile communication equipment in recent years, the demand has been increasing for a compact and thin TCXO of a surface-mounting type. Furthermore, it has become necessary for the TCXO to be able to meet its performance criteria whereby frequency and crystal impedance of a crystal unit fixedly held in a receptacle is required not to change after fabrication thereof due to heating applied when a lid is airtightly bonded to the receptacle, that is, excellent reflow resistant characteristics reflecting heat resistance.

Accordingly, to enable the TCXO to satisfy all the requirements described in the foregoing, the crystal unit, main component of the TCXO, needs to be a surface mounting type crystal unit, in addition to having all the characteristics required of the crystal unit, that can be fabricated in a compact and thin structure such that it is mounted directly on a printed wiring board without the use of metallic lead wires projecting from the receptacle.

For the TCXO as described above, a crystal unit provided with a quartz plate prepared by AT cut and having a characteristic of thickness share vibration, is normally used. Characteristics required of such a crystal unit are small frequency deviation at the normal temperature, and excellent continuity in frequency at fluctuating temperatures.

In addition, at various tests for exposure to the normal temperature and high temperatures, for resistance to cold, for resistance to humidity, temperature cycling test, oscillation test, drop test, and reflow resistance test, ratios of frequency drift after respective tests to a frequency before the tests are required to fall within plus or minus 1 ppm.

For fabrication of the surface mounting crystal unit satisfying such severe requirements as described above, it is necessary to select properly a receptacle for housing the crystal unit, a sealing means for tightly sealing the receptacle, and crystallographic axes for the quartz plate, together with setting of proper dimensions of the quartz plate.

Also, the selection of proper material for electrodes, designing a proper shape for the electrodes, the selection of a proper means of holding the quartz plate in the receptacle, and setting of a proper process condition are required.

FIGS. 20 and 23 show an example of a structure of a conventional surface mounting crystal unit.

In the aforesaid surface mounting crystal unit, a terminal ember 100 serving as a receptacle for housing a quartz plate 109 therein is airtightly sealed by fixedly attaching a lid 108 thereto by means of seam welding whereby electric current flows between welding electrodes 111 and 112.

The terminal member 100 is composed of multilayered ceramic substrate comprising three layers of ceramic containing alumina as main constituent, that is, a first substrate 101, a second substrate 102, and a third substrate 103. Electrode pads 104 are provided on top of the second substrate 102.

The electrode pads 104 are formed by sintering tungsten or molybdenum powders, and then plated with nickel. Further, the nickel plating is plated with gold.

The quartz plate 109 is cantilevered by bonding only one end thereof to the surface of the electrode pad 104 with an electrically conductive adhesive 105. The quartz plate 109 fixedly attached on the electrode pad 104 is electrically connected to the electrode pad 104 via the electrically conductive adhesive 105.

A seam ring 107 made of a cobalt-based alloy is fixedly attached to the surface of the third substrate 103 in the uppermost layer of the terminal member 100 by brazing with a silver alloy, and then the surface of the seam ring is plated with nickel. The nickel plating is further plated with gold.

The lid 108 covering the seam ring 107, made of cobalt-based alloy, is plated with nickel, and is airtightly bonded to the seam ring 107 by welding when electric current flows between the welding electrodes 111 and 112 of the parallel seam welder as described in the foregoing.

When bonding the lid 108 airtightly to the terminal member 100 serving as the receptacle as described above, the receptacle is filled up at atmospheric pressure with nitrogen having a low dew point. The reason for filling up the receptacle with nitrogen as above is to hold the frequency drift with time of the crystal unit constructed as above to a minimum.

Since the surface mounting crystal unit of FIG. 20 is constructed as above, crystal impedance thereof is in the order of 13 to 15Ω.

Furthermore, as the lid 108 is airtightly bonded to the terminal member 100 by means of the parallel seam welding, weldment does not attain a high temperature at the time of welding except for welded regions, and as the welded regions move along with the movement of the welding electrodes 111 and 112, the interior of the terminal member 100 in whole does not reach a high temperature, thus achieving low temperature bonding.

Consequently, there is no need of caring about heat resistance of the electrically conductive adhesive 105, offering an advantage in the selection of the material for the electrically conductive adhesive 105 from among materials in a wide range of choice.

Nevertheless, the conventional surface mounting crystal unit described above has drawbacks as described hereafter.

Specifically, FIG. 21 is a diagram showing a ratio of frequency drift with time of the surface mounting crystal unit fabricated by airtightly bonding the lid to the terminal member in a nitrogen atmosphere by means of the parallel seam welding wherein the abscissa indicates a length of time (days) from the time of airtight bonding the lid to the terminal member to the time of frequency measurement, and the ordinate a ratio of frequency drift to a frequency in a initial stage.

In the diagram, according to specification required of the surface mounting crystal unit, a ratio of frequency drift with the elapse of one year after airtight bonding to frequency immediately after the airtight bonding is to fall within plus or minus 1 ppm.

The diagram of FIG. 21 shows that in the case of frequency deviation curve D, a ratio of frequency drift after the elapse of 300 days falls within plus or minus 1 ppm as required by the specification, however, in the cases of frequency deviation curves A and B, ratios of frequency drift shifted widely toward the plus side or the minus side, respectively, and it took many days until the ratios of frequency drift stabilized.

As a result, in either case of frequency deviation curves A and B, a ratio of frequency drift one year after completion of airtight bonding does not meet the specification as required of the surface mounting crystal unit, that is, within plus or minus 1 ppm to an initial frequency immediately after completion of the airtight bonding.

Then, in the case of the surface mounting crystal unit having the frequency deviation curve A or B, it was difficult to determine a product quality in a delivery stage soon after completion of the airtight bonding of the lid because it took many days until the ratio of frequency drift stabilized.

Yet, since it was impractical to spend too may days in measuring the ratios of frequency drift on all products, there have been problems that some products having the frequency deviation curve A or B are undetected and delivered to the market.

Further, there has been another problem with the conventional surface mounting crystal unit as described with reference to FIG. 20 that the results of drop tests thereon were not satisfactory as described hereafter.

This point will be described in detail hereafter.

The surface mounting crystal unit as shown in FIG. 20 is structured such that only one end of the quartz plate 109 is fixedly supported therein in a cantilever fashion, and the electrode pad 104 is provided with two terminals as shown in FIG. 23, and one end of the quartz plate 109 is fixedly attached on both of the electrode pads 104 and 104 with the electrically conductive adhesive 105.

FIG. 22 shows the results of drop tests conducted on the surface mounting crystal unit fabricated as above. In these tests, the surface mounting crystal unit was allowed to free fall onto a concrete floor from a height of 1.5 meters, and then the frequency thereof was measured, determining a ratio of frequency drift after each of the drop tests to a frequency measured before the test.

In a bar graph of FIG. 22, the abscissa indicates the number of drops which a testpiece underwent while the ordinate indicates a ratio of frequency drift. The specification requires a ratio of frequency drift of acceptable surface mounting crystal units to fall within plus or minus 1 ppm of a frequency before each of the drop tests as described above.

In FIG. 22, the results of the drop tests conducted on the surface mounting crystal units as described in FIGS. 20 and 23 are indicated by hatched parallel bars marked with F.

According to the results of the aforesaid tests, the ratio of frequency drift of the surface mounting crystal unit described above remained within plus or minus 1 ppm up to a tenth test. However, at a twentieth test, it was found to exceed the specification limit of plus or minus 1 ppm widely.

The above was caused presumably as follows. As described with reference to FIGS. 20 and 23, the surfaces of the electrode pads 104 are plated with gold, and a gold plating is further coated with the silicone-based electrically conductive adhesive 105, to which the quartz plate 109 is bonded. Since an adhesive strength between silicone and the gold plating on the electrode pads 104 is not strong enough, exfoliation occurred at the interface in-between at the twentieth drop test.

SUMMARY OF THE INVENTION

It is an object of the invention to provide a surface mounting crystal unit wherein a ratio of frequency drift with the elapse of time to an initial frequency falls within a range required under the specification, and the ratio of frequency drift stabilizes early on so that definite judgment on product quality can be made at an early stage of product delivery, solving all the drawbacks of conventional surface mounting crystal units.

It is another object of the invention to provide a surface mounting crystal unit wherein the ratio of frequency drift after a drop test is kept to a minimum.

In order to achieve aforesaid objects of the invention, in the surface mounting crystal unit comprising a quartz plate, a terminal member resembling a receptacle for holding the quartz plate inserted from an opening thereof so as to be able to oscillate the quartz plate therein, and a lid for covering the opening of the terminal member; the quartz plate is formed in the shape of a rectangular parallelepiped, one or both of the shorter sides at the opposite longitudinal ends of the quartz plate are fixedly attached on one or both of flat surface portions of the terminal member by use of an electrically conductive adhesive of high plasticity, and the lid is airtightly bonded to the opening of the terminal member with an inorganic material while a vacuum is produced inside of the terminal member thus airtightly sealed.

Even if the surface mounting crystal unit fabricated as above should be dropped, the adhesive of high plasticity used for fixedly mounting the quartz plate on the flat surface portions of the terminal member acts as a buffer absorbing the impact of such a drop, thereby preventing the quartz plate from receiving an impact large enough to cause a change in its oscillating frequency. Consequently, a stable frequency is maintained.

Further, due to the use of the inorganic material for airtight bonding of the lid to the terminal member, there is less chance of minuscule leakage occurring than in the case of an adhesive made of an organic material being used for airtight bonding of the lid. Accordingly, the ratio of frequency drift with time to the initial frequency is reduced so as to fall within a required specification.

Further, any minuscule leakage from the airtightly bonded part between the lid and the terminal member can be quickly detected from a change in crystal impedance of the quartz plate since the inside of the terminal member in a receptacle shape is in a vacuum.

For the adhesive described above, a silicone-based or urethane-based electrically conductive adhesive may be preferably used. For the inorganic material used for airtight bonding of the lid to the opening of the terminal member, a solder may be preferably used. Then, as the solder has a low melting point, airtight bonding is effected with ease, and for the solder, an alloy consisting of gold and tin, an alloy consisting of lead, silver, and tin, or an alloy consisting of lead and tin may be used.

Otherwise, the lid may be airtightly bonded to the opening of the terminal member by means of seam welding, producing a vacuum inside of the terminal member airtightly sealed.

Also, the surface mounting crystal unit may be fabricated such that the quartz plate is formed in the shape of a rectangular parallelepiped by cutting in the direction of an AT cut relative to a crystallographic axis and disposed so that longer sides of the rectangular parallelepiped run in parallel with a Z' axis while shorter sides thereof are in parallel with a X axis crossing the Z' axis at right angles, and one or both of the shorter sides at the opposite longitudinal ends of the quartz plate are fixedly mounted on one or both of flat surface portions, respectively, of the terminal member by use of an electrically conductive adhesive of high plasticity, the lid being airtightly bonded to the opening of the terminal member with the solder while a vacuum is produced inside the terminal member airtightly sealed.

With the quartz plate disposed as above, the effect of thicknesswise slip oscillation is reduced by fixedly mounting the shorter sides at the opposite ends of the quartz plate disposed along the Z' axis on the flat surface portions of the terminal member because of a characteristic of oscillation waves caused by the thicknesswise slip oscillation propagating mainly toward the X axis but less toward the Z' axis.

In the surface mounting crystal unit, the lid may be airtightly bonded to the opening of the terminal member by means of seam welding.

Also, the surface mounting crystal unit may be fabricated such that the quartz plate is formed in the shape of a rectangular parallelepiped by cutting in the direction of an AT cut relative to the crystallographic axis and disposed so that the longer sides of the rectangular parallelepiped run in parallel with the X axis while shorter sides thereof are in parallel with the Z' axis crossing the X axis at right angles, and one of the shorter sides of the quartz plate is fixedly mounted on a flat surface portion of the terminal member by use of a silicone-based, urethane-based, or polyimide-based electrically conductive adhesive of high plasticity, the lid being airtightly bonded to the opening of the terminal member with the solder while a vacuum is produced inside the terminal member airtightly sealed.

Even with the quartz plate disposed as above, the effect of thicknesswise slip oscillation is contained because oscillation waves caused by the thickness share vibration propagate mainly toward the X axis, but less toward the Z' axis.

In the surface mounting crystal unit, the lid may be airtightly bonded to the opening of the terminal member by means of seam welding.

Further, non-pad portions each in the shape of a square or circle may preferably be provided in the middle part or on one or both edges of electrode pads formed at quartz plate fixture mounts of the terminal member, for securely holding one or both of the shorter sides of the quartz plate, so that the quartz plate is fixedly attached to the quartz plate fixture mounts by adhering the electrically conductive adhesive to both the electrode pads and the non-pad portions.

Then, even in case of the electrically conductive adhesive showing poor adhesive strength between the quartz plate and the electrode pads, the electrically conductive adhesive can attain a high adhesive strength therebetween since the quartz plate is bonded to both the electrode pads and the non-pad portions of the quartz plate fixture mounts with the electrically conductive adhesive.

In fixedly attaching the quartz plate to the quartz plate fixture mounts by use of the electrically conductive adhesive, effective bonding is achieved by applying the electrically conductive adhesive to both the quartz plate and the quartz plate fixture mounts.

Further, the surface mounting crystal unit may preferably be fabricated such that the quartz plate is provided with electrodes in regions where the quartz plate is fixedly attached to the electrode pads, having non-electrode portions each in the shape of a square or circle in the middle part or on external edges of the respective electrodes and the quartz plate is fixedly attached to the quartz plate fixture mounts with the electrically conductive adhesive applied to both the quartz plate and the quartz plate fixture mounts.

The fixture of the quartz plate is ensured further because both the electrodes and the non-electrode portions of the quartz plate are thus fixedly attached to the quartz plate fixture mounts.

The surface mounting crystal unit comprising the quartz plate provided with the electrodes having non-electrode portions therein may preferably be fabricated such that the lid is airtightly bonded to the opening of the terminal member by use of the solder, and the quartz plate is formed in the shape of a rectangular parallelepiped by cutting in the direction of an AT cut relative to the crystallographic axis.

Then, minuscule leakage is unlikely to occur as the airtight bonding of the lid is further ensured, and the effect of the thickness share vibration is kept to a minimum.

Furthermore, the surface mounting crystal unit may preferable be fabricated such that the lid is made of a metal, the surface thereof is plated with nickel, and the nickel plating is further plated with gold, palladium, or a nickel-palladium alloy, otherwise, the surface of the lid is plated with nickel, a nickel plating is plated with a nickel-palladium alloy, and the nickel-palladium alloy plating is further plated with palladium or gold.

Thereupon, wettability of the lid against the terminal member is enhanced, and the adhesive strength at airtight bonding is enhanced, ensuring airtight bonding with little likelihood of leakage.

The above and other objects, features, and advantages of the invention will be apparent from the following detailed description which is to be read in conjunction with the accompanying drawings.

BRIEF DESCRIPTION OF THE DRAWINGS

FIGS. 1 to 4 show a first embodiment of a surface mounting crystal unit according to the invention, in which FIG. 1 is a longitudinal sectional view, FIG. 2 a plan view, FIG. 3 a longitudinal sectional view of a lid bonded to the surface mounting crystal unit, and FIG. 4 a plan view illustrating a quartz plate provided in the surface mounting crystal unit.

FIG. 5 is a diagram showing the relationship between crystal impedance of the crystal unit and the degree of vacuum.

FIGS. 6A and 6B are schematic illustrations showing an example of an apparatus for bonding airtightly the lid of the surface mounting crystal unit to a airtight sealing portion thereof in a vacuum condition.

FIGS. 7 to 9 show a second embodiment of the surface mounting crystal unit according to the invention, in which FIG. 7 is a longitudinal sectional view, FIG. 8 a partial plan view, and FIG. 9 a plan view, similar to FIG. 4, illustrating the quartz plate provided in the surface mounting crystal unit.

DETAILED DESCRIPTION OF THE PREFERRED EMBODIMENTS

[First Embodiment: FIGS. 1 to 4]

Referring to FIGS. 1 to 4, a first embodiment of a surface mounting crystal unit according to the invention is described hereafter.

Figure 1:
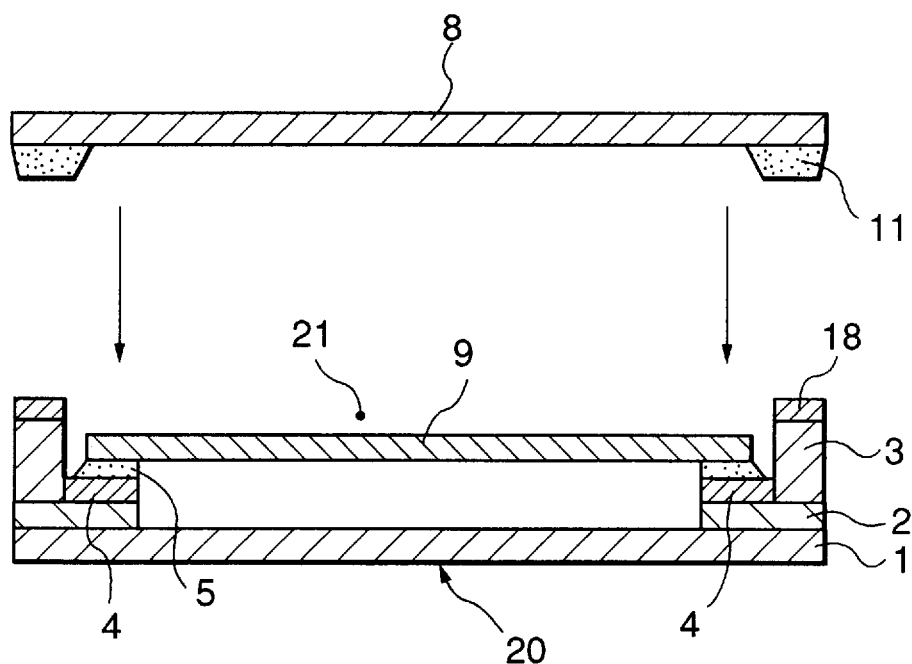
Figure 2:
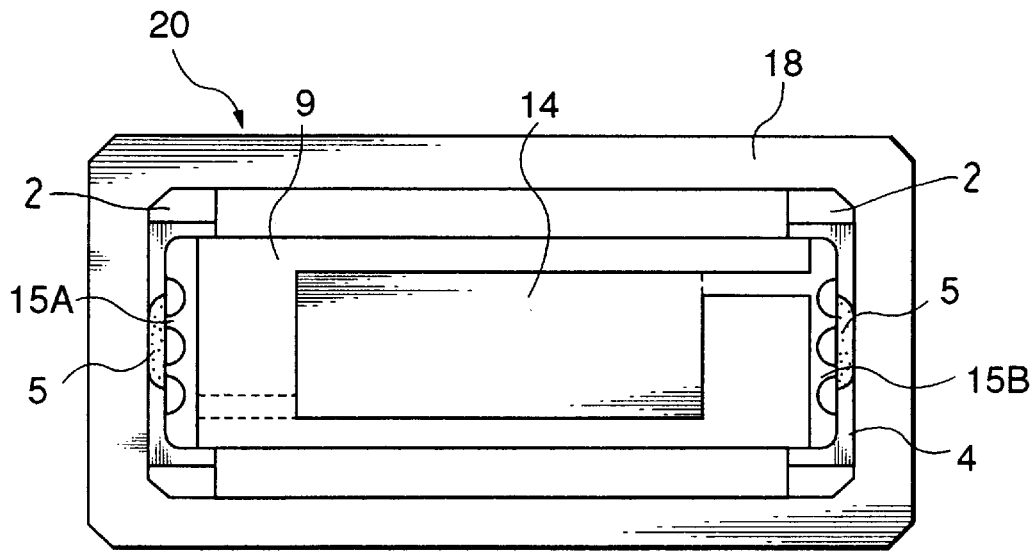
Figure 4:
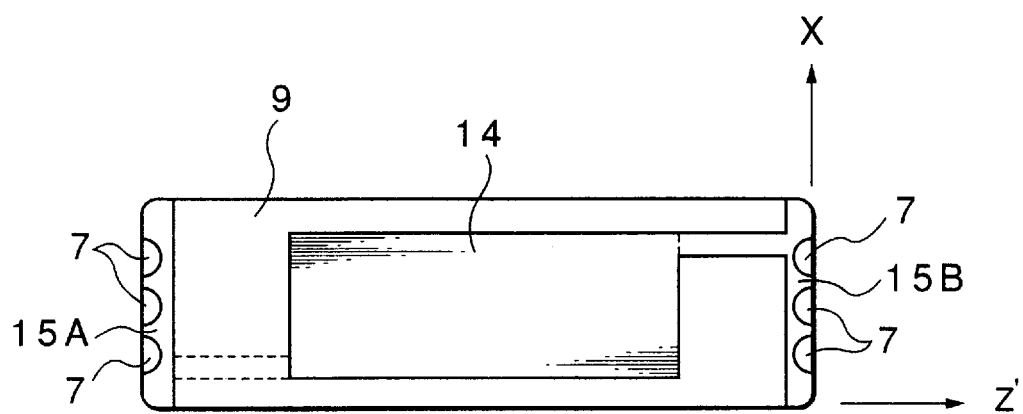

As shown in FIGS. 1 and 2, a terminal member 20 of the surface mounting crystal unit is composed of multi-layered ceramic substrate comprising a first substrate 1, a second substrate 2, and a third substrate 3. The terminal member 20 serves as a receptacle wherein a quartz plate 9 formed in the shape of a rectangle in a plan view as shown in FIG. 4 is inserted from an opening as shown in FIG. 1, and fixedly held so as to be able to oscillate.

Specifically, electrode pads 4 are formed on top of the second substrate 2 of the terminal member 20, opposite to both ends of the quartz plate 9, respectively, and an airtight sealant 18 is formed on top of the third substrate 3 along the entire periphery thereof. Both the electrode pads 4 and the airtight sealant 18 are formed by sintering tungsten or molybdenum powders, and the surface of the tungsten or molybdenum coating is plated with nickel. The surface of the nickel plating is further plated with gold.

Then, as shown in FIG. 1, the quartz plate 9 in the shape of a rectangular parallelepiped is inserted and disposed in the terminal member 20 such that shorter sides of the quartz plate 9 at both longitudinal ends thereof are placed on the flat surfaces of the electrode pads 4 and 4 provided on both sides of the terminal member 20, respectively, so as to span a space therebetween, and the quartz plate 9 is fixedly held at both ends by bonding with a soft adhesive, for example, a silicone-based electrically conductive adhesive 5.

The terminal member 20 is covered by a lid 8 formed corresponding to the size of the airtight sealant 18 so as to close an opening 21. A solder 11 made of an inorganic material is adhered to the underside of the lid 8 along the periphery thereof, opposite to the airtight sealant 18.

Figure 3:
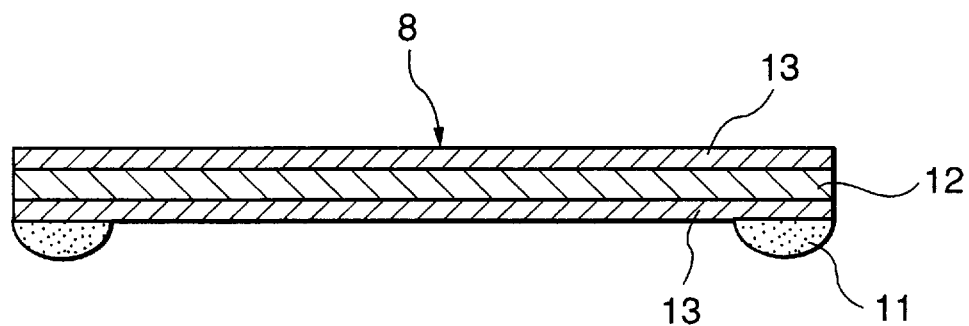

As shown in FIG. 3, the lid 8 is fabricated by forming surface treatment films 13 on both faces of a base material 12 by means of a plating process and for the base material 12, a metal, for example, cobalt-based alloy, iron-nickel alloy, and the like is used. However, ceramic, glass ceramic, or glass may be used as well for the base material 12. In such an instance, a combination of the terminal member 20 and the lid 8, thermal expansion coefficients thereof matching each other, is preferable.

For the surface treatment films 13, a double-layered structure composed of a gold plating formed by plating with gold on top of a nickel plating formed by plating with nickel, a double-layered structure composed of a palladium plating formed on top of the nickel plating, or a double-layered structure composed of a nickel-palladium alloy plating formed by plating with nickel-palladium alloy on top of the nickel plating is employed.

Further, the surface treatment films 13 may be formed by plating the nickel plating with a nickel-palladium alloy, and additionally plating the nickel-palladium plating with palladium or gold.

The nickel plating applied as described above in forming the surface treatment films 13 contributes to improvement in corrosion resistance property thereof while the gold plating or the palladium plating contributes to improvement in wettability (adhesive property) thereof with the solder 11.

Further, the reason for using palladium in forming the surface treatment films 13 is that palladium has a property of not suffering from erosion by the solder 11, thereby minimizing a risk of leakage from airtightly sealed regions.

As a material for the solder 11, gold (Au)-tin (Sn) alloy, lead (Pb)-silver (Ag)-tin (Sn) alloy, lead (Pb)-tin (Sn) alloy, or the like may preferably be used, however, other metals may be used for the solder 11 provided that the same are materials having a low melting point and suitable for airtight bonding.

The solder 11 bonded to the underside of the lid 8 along the entire periphery thereof is deposited in a vacuum on the airtight sealant 18 formed on the third substrate 3 as shown in FIG. 1. Consequently, the inside of the terminal member 20 remains vacuum even after the opening 21 of the terminal member 20 is closed and airtightly bonded with the lid 8.

Accordingly, as indicated in FIG. 5 showing the relationship between the crystal impedance of a crystal unit and the degree of vacuum, the crystal impedance of the crystal unit fixedly held in a vacuum can be reduced to about a half (5 to 7Ω) of the same at the atmospheric pressure, that is, 13 to 15Ω.

It follows that the surface mounting crystal unit according to this embodiment of the invention can be driven with less power consumption because resistance encountered when activating the quartz plate 9 thereof is reduced to an extent that the crystal impedance is lowered. Thus, the consumption of electric power is reduced and a battery life of a cellular, pager or the like is extended, resulting in economical driving.

If the solder 11 for bonding the lid 8 airtightly to the terminal member 20 is made of, for example, gold (Au) and tin (Sn), the melting temperature thereof is about 300° C. In such a case, it takes a few minutes to bond the lid 8 to the airtight sealant 18 of the terminal member 20 by depositing the solder 11 in-between. Such a deposition process is carried out by the use of an apparatus provided with a heater base plate on which a plurality of workpieces can be processed simultaneously as shown in FIG. 6A by way of an example.

The apparatus is provided with a airtight chamber 90 having an outlet 91 and incorporating a holder 92 on which a setting jig 93 is attached. The setting jig is provided with a plurality of parts setting holes 93a, each for setting the lid 8 and the terminal member 20 therein. The parts setting jig 93 made of carbon is so disposed as to be heated by a heater 94.

Further, the inside of the airtight chamber 90 under the atmospheric pressure can be made vacuum by driving a vacuum pump 95.

For bonding the lid 8 airtightly to the airtight sealant 18 of the terminal member 20 with the solder 11 using the apparatus as shown in FIG. 6, the outlet 91 is opened, and then the lid 8 is inserted into each of the parts setting holes 93a, with a bonding surface of the lid 8, facing upward, as shown in the figure.

Then, the solder 11 formed, for example, in a sheet shape and punched out in the shape of a frame corresponding to the airtight sealant 18 as shown in the figure is placed on top of the lid 8 inside each of the parts setting holes 93a. Subsequently, the terminal member 20 incorporating the quartz plate 9 fixedly held in a predetermined position and with the airtight sealant 18 facing downward is inserted into each of the parts setting holes 93a and placed on top of the solder 11, and the airtight chamber 90 is made airtight by closing the outlet 91.

In FIG. 6B, for the convenience of illustrating the shape of the solder 11 in whole, only the solder 11 is shown in a perspective view.

After setting respective parts in the aforesaid manner, the vacuum pump 95 is activated keeping the airtight chamber 90 in a airtight condition. Then, the heater 94 is heated with a predetermined timing so that the solder 11 reaches a melting point just when a predetermined degree of vacuum is attained in the airtight chamber 90.

As soon after the solder 11 melts, causing the lid 8 to be bonded and fixed to the airtight sealant 18, supply of power to the heater 94 is stopped to prevent unnecessary heating.

In this way, the lid 8 can be airtightly bonded to the terminal member 20 with ease and in a short time.

In fabricating the surface mounting crystal unit as described above by fixedly bonding the lid 8 to the airtight sealant 18 of the terminal member 20 inside the airtight chamber 90, sealing between the lid 8 and the airtight sealant 18 proceeds while the degree of vacuum in the airtight chamber 90 is heightened by driving the vacuum pump 95.

As a result, even if gas evolves when the solder 11 melts, the greater part of such gas is discharged into the airtight chamber 90 at a pressure lower than that in the terminal member 20. Consequently, there is little risk of the quartz plate 9 fitted inside the terminal member 20 being contaminated by the gas. Therefore, the oscillation frequency of the surface mounting crystal unit according to this embodiment stabilizes early on, enabling judgment in an early stage of product delivery on whether or not the ratio of frequency drift falls within the requirement of the specification.

On the other hand, in case that the inside of the terminal member airtightly sealed is at the atmospheric pressure, there is little difference in pressure between inside and outside of the terminal member even if there should be a minuscule leakage from a region where the lid is airtightly bonded to the terminal member, and therefore, the crystal impedance of the crystal unit is not different from that at atmospheric pressure as described with reference to FIG. 5, that is, 13 to 15Ω. Even then, from a long range point of view, the frequency drift occurs.

This is because gradual ingress of the atmosphere into the terminal member, which is supposed to be an airtightly sealed receptacle, occurs over a long period of time. In the case of the surface mounting crystal unit wherein the lid is airtightly bonded to the terminal member at the atmospheric pressure, a leakage test conducted before delivery using a helium leakage tester can not detect a minuscule leakage occurring to such an extent of causing frequency drift with the elapse of time.

Since, in the surface mounting crystal unit according to this embodiment, the lid 8 is airtightly bonded to the terminal member 20 while the inside of the terminal member 20 is kept in a vacuum condition as described in the foregoing, the crystal impedance of the crystal unit is as low as 5 to 7Ω. Accordingly, if a minuscule leakage as described in the foregoing should occur in airtightly bonded regions of the lid 8, the pressure in the terminal member 20 serving as the receptacle undergoes a change, causing an immediate increase in the crystal impedance sensitive to a change in the pressure inside the receptacle.

Therefore, judgment on whether or not the leakage described above has occurred can be made with certainty by measuring the magnitude of an increase in the crystal impedance. This makes it possible to identify definitely the surface mounting crystal units that may undergo the frequency drift after the elapse of a long time at an early stage of product delivery.

Further, in this surface mounting crystal unit wherein the solder 11 made of inorganic material is used for airtightly bonding the lid 8 to the airtight sealant 18, the use of the inorganic material enables airtight bonding of high reliability as against the case of using an adhesive made of organic materials where airtightness between molecules composing the adhesive is difficult to maintain.

In addition, as the melting temperature of the solder 11 is low at around 300° C. as described in the foregoing, excessive heating of respective parts making up the surface mounting crystal unit does not occur at the time of airtight bonding, and thermal deformation of the parts is therefore prevented. Consequently, the crystal unit has a characteristic of preventing the frequency drift from occurring, that is, a good reflow-resistant characteristic.

In the surface mounting crystal unit according to this embodiment, shorter sides at the opposite ends of the quartz plate 9 are fixed to the electrode pads 4 and 4 disposed on both the left and right sides of the terminal member 20, respectively, with an electrically conductive adhesive 5 of high plasticity. Accordingly, even if a mechanical stress is exerted on the surface mounting crystal unit in the event of the same being dropped or a stress is exerted due to a difference in thermal expansion coefficient between the quartz plate 9 and the ceramics making up the terminal member 20, such stresses can be buffered by the electrically conductive adhesive 5.

An adhesive for use as the electrically conductive adhesive 5 is not limited to an silicone-based adhesive. An urethane-based or other adhesives may be used provided that it is an adhesive of high plasticity.

In this embodiment, ceramic containing alumina as main constituent is used for the terminal member 20 composed of the first, second, and third substrates, 1, 2, and 3, respectively, however, glass ceramic or glass may be used as well for the terminal member 20. In case that the terminal member 20 is made of glass ceramic, silver or a mixture of silver and palladium may be preferably used for forming the electrode pads 4 and the airtight sealant 18.

Also, the construction of the terminal member 20 is not limited to three-layered substrates, it may be two-layered substrates without the second substrate 2, and may even be a single-layered substrate, the whole terminal member 20 being composed of one substrate.

In the surface mounting crystal unit according to this embodiment, the quartz plate 9 is formed in the shape of a rectangle as shown in FIG. 4 by cutting in the direction of an AT cut relative to the crystallographic axis such that longer sides of the rectangle run in parallel with the Z' axis while the shorter sides thereof are in parallel with the X axis crossing the Z' axis at right angles.

Specifically, oscillating waves of thicknesswise slip oscillation caused by excitation electrodes 14 disposed substantially at the center of the quartz plate 9 propagate mainly in the direction toward the X axis, and less in the direction toward the Z' axis. With due regard in advance for such a characteristic of the oscillating waves as described above, the shorter sides of the rectangle at both the left and right ends thereof along the Z' axis are fixedly bonded to the electrode pads 4 and 4, disposed on the left and right sides (refer to FIGS. 1 and 2), respectively, opposite the aforesaid shorter sides of the rectangle.

As a result, the effect of the thicknesswise slip oscillation caused by the excitation electrode 14 can be held to a minimum.

Reference numerals 15A and 15B in FIG. 4 indicate edge electrodes provided on the shorter sides of the quartz plate 9, and the edge electrode 15A is electrically connected to the excitation electrode 14 provided on the underside surface of the quartz plate 9 while the edge electrode 15B is connected to the excitation electrode 14 provided on the topside surface of the quartz plate 9. Reference numerals 7 indicate nonelectrode portions where the edge electrode 15A or 15B is not formed and the surface of the quartz plate 9 is exposed in a semicircle shape.

With the surface mounting crystal unit constructed as above, a ratio of frequency drift with time can be reduced in comparison with that of a conventional surface mounting crystal unit as described with reference to a diagram in FIG. 21. Also, soon after airtight sealing of the quartz plate 9 into the terminal member 20, stability in the ratio of frequency drift described above is achieved.

Figure 21:
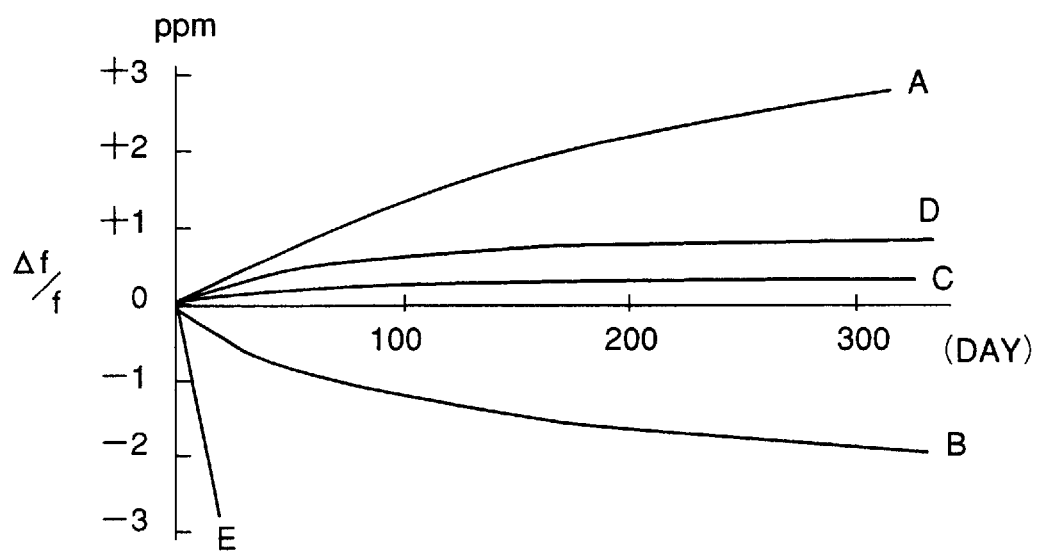
FIG. 21 is a diagram showing ratios of frequency drift with time of the surface mounting crystal units.

Specifically, with reference to FIG. 21, a frequency deviation curve C represents the ratio of frequency drift with time in the case of the surface mounting crystal unit according to this embodiment of the invention.

Figure 20:
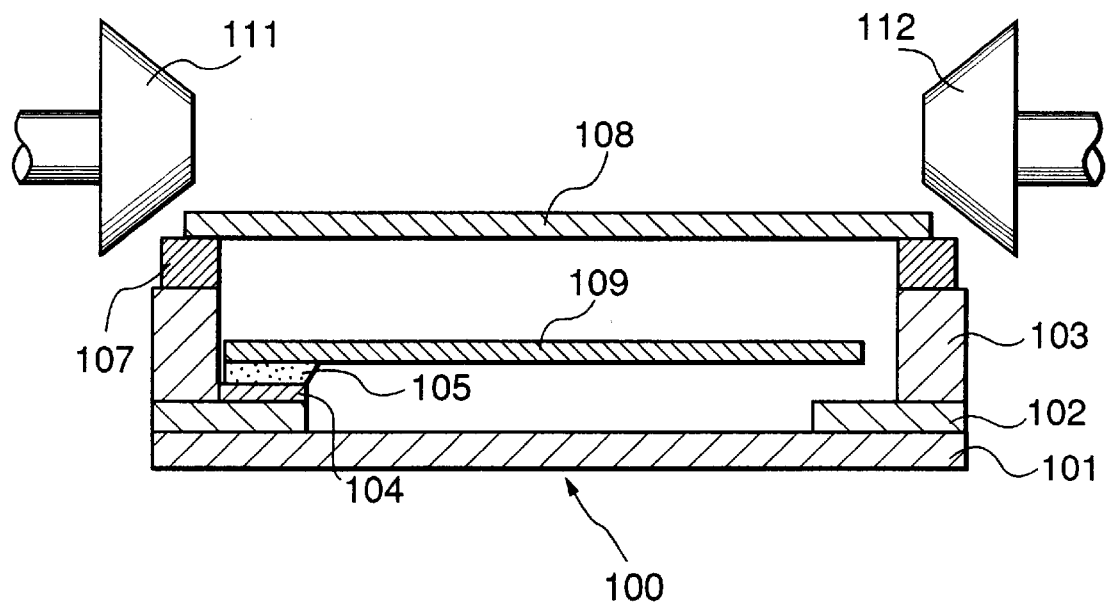
FIG. 20 is a longitudinal sectional view illustrating an example of the structure of a conventional surface mounting crystal unit.
Figure 23:
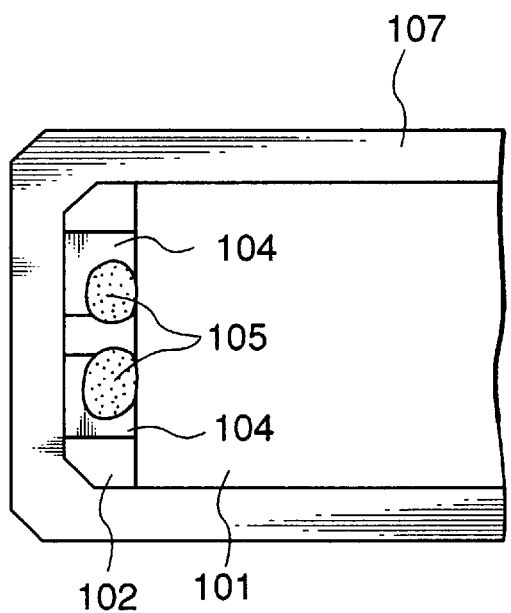
FIG. 23 is a plan view showing the vicinity of one of electrode pads of a conventional surface mounting crystal unit.

On the other hand, in the case of the conventional surface mounting crystal unit as described with reference to FIGS. 20 and 23, since a quartz plate is fixedly held in a terminal member filled up with nitrogen at the atmospheric pressure, and the terminal member in the shape of a receptacle is sealed with a lid airtightly by means of the seam welding, a ratio of frequency drift with time after the elapse of about one year was found to exceed a required range of plus or minus 1 ppm as indicated by frequency deviation curves A and B shown in FIG. 21. Also, as a frequency deviation curve D indicates, even when the ratio of frequency drift fell within plus or minus 1 ppm, a considerable length of time was required until it stabilized.

However, in the case of the surface mounting crystal unit according to this embodiment of the invention, the ratio of frequency drift (absolute numerical values) with the elapse of a long time after airtight sealing of the quartz plate 9 in the terminal member 20 declined as the frequency deviation curve C indicates, thus meeting the specification as required, according to which the ratio of frequency drift after the elapse of one year from the time of the airtight sealing of the terminal member to an initial frequency is to fall within plus or minus 1 ppm.

Further, with the surface mounting crystal unit according to this embodiment, in the event that a product is not up to standard, the ratio of frequency drift undergoes a significant change in a short period of time after the airtight sealing of the terminal member 20 as a frequency devation curve E in FIG. 21 indicates.

Accordingly, it is possible to identify definitely an inferior product in a shorter time as compared with the case of the conventional surface mounting crystal unit, ensuring the verification of product quality at the stage of product delivery.

Furthermore, in the surface mounting crystal unit according to this embodiment wherein the shorter sides of the quartz plate 9 at the opposite ends thereof are fixedly held by the electrode pads 4 and 4, provided on both the left and right sides, respectively, of the terminal member 20 with an adhesive of high plasticity, that is, the silicone-based electrically conductive adhesive 5, the impact of a drop, is buffered by the electrically conductive adhesive 5 of high plasticity.

Figure 22:
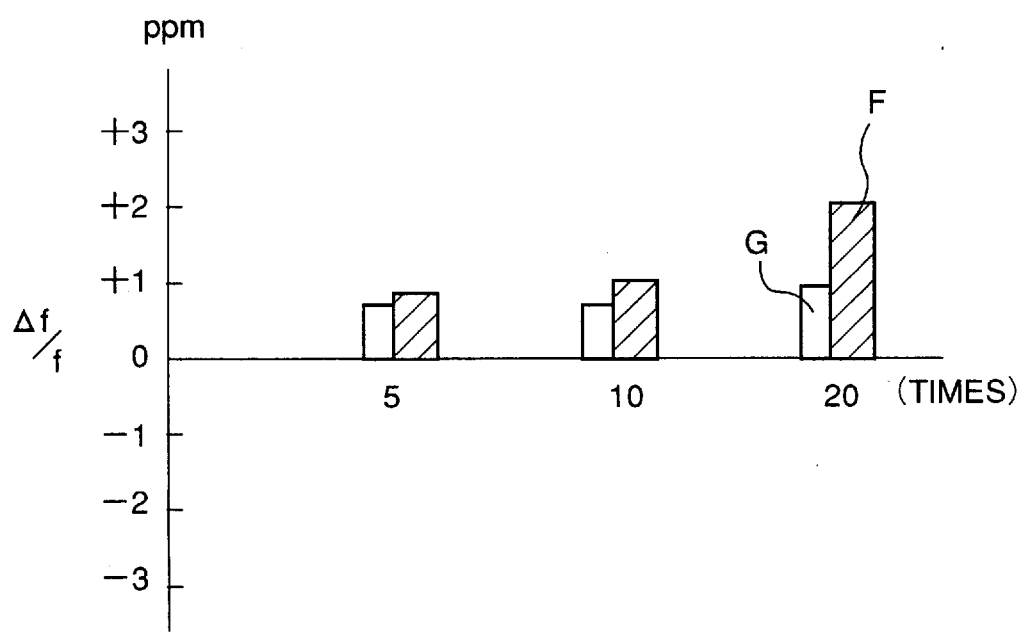
FIG. 22 is a bar graph showing ratios of frequency drift of the surface mounting crystal units after drop tests.

Accordingly, referring to FIG. 22 wherein the results of drop tests conducted on the surface mounting crystal unit as shown in FIG. 1 is compared with the same conducted on the conventional surface mounting crystal unit, the ratio of frequency drift in the case of the surface mounting crystal unit according to this embodiment of the invention was found to remain within plus or minus 1 ppm to the frequency at an initial stage of production as required by the specification even after repeating drop tests twenty times as shown by lengths of blank bars of a bar graph in FIG. 22.

Figure 7:
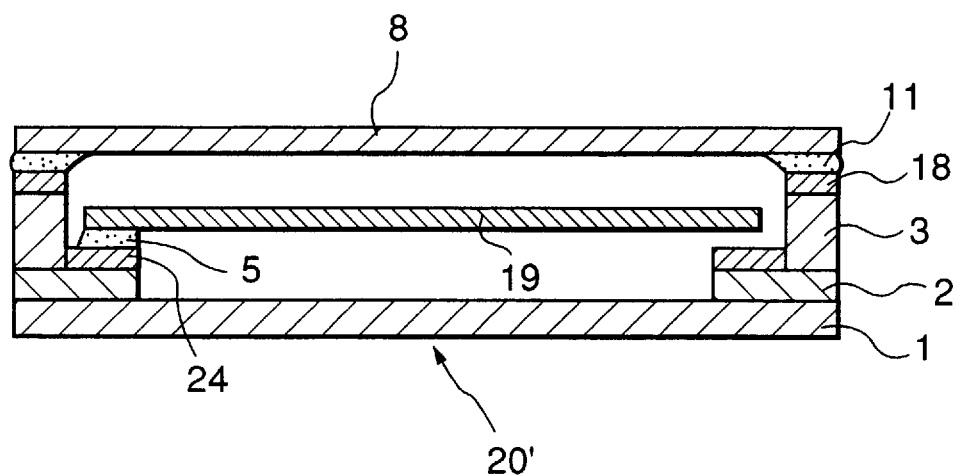
Figure 8:
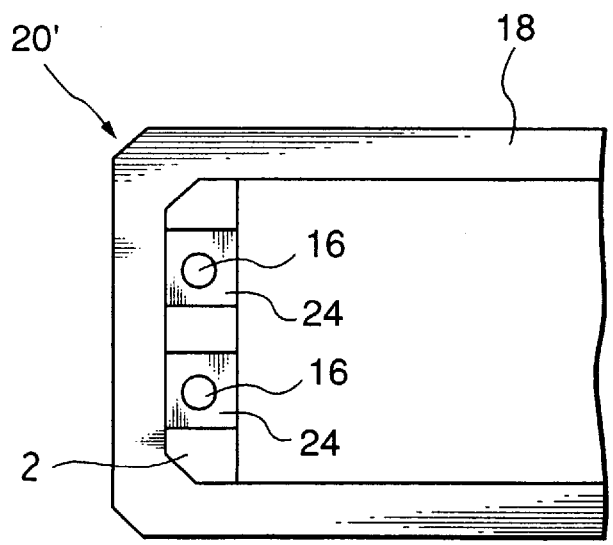
Figure 9:
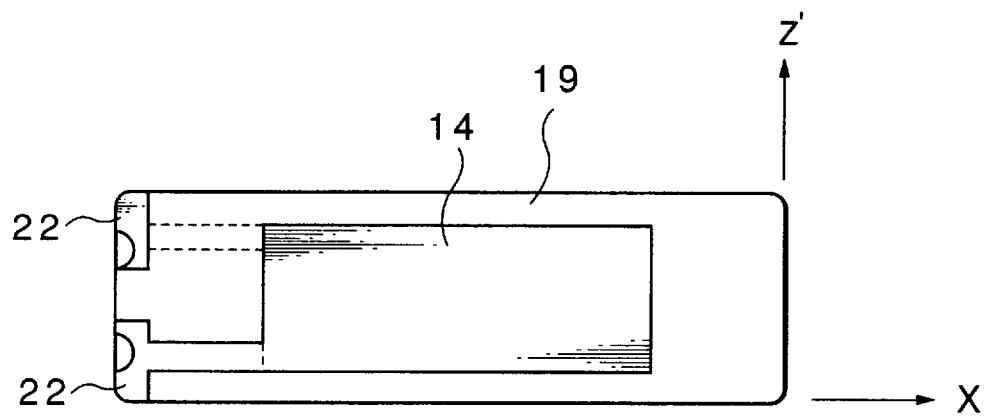

[Second Embodiment: FIGS. 7 to 9]

FIG. 7 shows a second embodiment of a surface mounting crystal unit according to the invention, wherein parts corresponding to the same in FIG. 1 are designated with the same reference numerals, and description thereof is omitted.

The second embodiment of the invention differs from the surface mounting crystal unit described in FIG. 1, wherein the quartz plate 9 is fixedly held at both ends thereof, in that a quartz plate 19 is fixedly held only at one end thereof on the left side as seen in FIG. 7.

As shown in FIG. 8, a terminal member 20' is provided with two-terminal electrode pads with 24 and 24, formed opposite to one fixing end of the quartz plate 19, and one of the shorter sides of the quartz plate 19 is fixedly attached to the respective electrode pads 24 by bonding with the electrically conductive adhesive 5.

For the electrically conductive adhesive 5, a silicone-based or urethane-based adhesive may be used, however, in such a case as this where the quartz plate 19 is fixedly held in a cantilever fashion, a polyimide-based adhesive of high plasticity having electrical conductivity, slightly harder than the silicone-based or urethane-based adhesive, may be preferably used from the viewpoint of reinforcing a fixedly holding strength.

The electrode pads 24 have circle shaped non-pad opening portions 16 which expose the ceramic surface of the second substrate 2.

Further, in this embodiment where the quartz plate 19 is fixedly held only at one end where edge electrodes 22 and 22 are provided, the quartz plate 19 is disposed such that the directions of crystallographic axes thereof are reversed as compared with the same as illustrated in FIG. 4 so that the longer sides of the quartz plate 19 run in parallel with the X axis, and shorter sides thereof are in parallel with the Z' axis as shown in FIG. 9.

Then, even though the surface mounting crystal unit is constructed such that one of the shorter sides of the quartz plate 19 is fixedly attached to the two electrode pads 24 and 24, thereby cantilevering the quartz plate 19, stability in frequency is attained similarly to the case of the surface mounting crystal unit wherein the quartz plate is fixedly held at both ends thereof, as illustrated in FIG. 1, even by the use of an electrically conductive adhesive, slightly harder than the silicone-based or urethane-based adhesive, such as a polyimide-based adhesive for the electrically conductive adhesive 5 because oscillating waves of the thicknesswise slip oscillation propagate less in the direction of the Z' axis as described in the foregoing.

[Examples of Variously-Shaped Electrode Pads of the Surface Mounting Crystal Unit: FIGS. 10 to 14]

Figure 10:
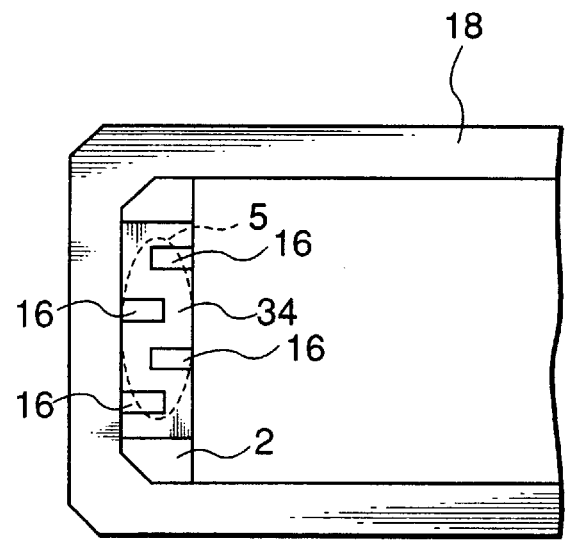
FIG. 10 is a partial plan view illustrating an example of a plurality of square-shaped non-pad portions formed on both edges of respective electrode pads of the surface mounting crystal unit according to the invention.

FIG. 10 is a partial plan view showing the vicinity of an electrode pad, provided in the terminal member of the surface mounting crystal unit, designed so as to be able to reduce a ratio of frequency drift caused by drop tests.

In this surface mounting crystal unit, a plurality of square-shaped non-pad portions 16 are formed on an electrode pad 34 provided on the second substrate 2, by exposing parts of the second substrate 2 such that the non-pad portions 16 are extended inward to a predetermined length from either the left or the right edge of the electrode pad 34 as seen in FIG. 10. Further, the plurality of the non-pad portions 16 are disposed in a staggered fashion along the length of the electrode pad 34, and on the right and left edge thereof alternately as seen in the figure.

After adhering the electrically conductive adhesive 5 to both the electrode pad 34 and the respective non-pad portions 16, the quartz plate 9 (as referred to in FIG. 1) is bonded to the electrode pad 34 and the non-pad portions 16.

In FIG. 10, the square-shaped non-pad portions 16 are shown by way of an example, however, the non-pad portions may be formed in other shapes, for example, circles.

The surface mounting crystal unit fabricated as above has a highly reliable impact-resistant property when dropped because the electrically conductive adhesive 5 is adhered to both the electrode pad 34 and the non-pad portions 16 in a region where the quartz plate 9 is fixedly attached to the second substrate 2, and the quartz plate 9 (as referred to in FIG. 1) is bonded to the electrode pad 34 and the non-pad portions 16 where parts of the substrate 2 made of ceramic are exposed.

More specifically, in this embodiment of the invention, the surface of the electrode pad 34 is plated with gold, similarly to the case of the embodiment described with reference to FIG. 1, and when the quartz plate 9 is fixedly attached to only a gold plated surface of the electrode pad 34 by bonding with the electrically conductive adhesive 5 made of, for example, a silicone-based material, exfoliation occurs at a bonding interface after repeated drop tests in the order of twenty times because of generally low adhesive strength (bonding strength) between gold and silicone.

Further, the smaller the surface roughness of respective components bonded together, the lower the adhesive strength becomes, thus causing exfoliation at the bonding interface with greater ease.

However, in this embodiment, the quartz plate 9 can be securely held by a high adhesive strength since the quartz plate 9 is bonded additionally to ceramic parts having a high adhesive strength against an electrically conductive adhesive such as a silicone-based adhesive, and the like by partially exposing the surface of the ceramic parts.

Also, as there are numerous protrusions and depressions on the surface of ceramic parts, and bonding is effected by the ingress of the electrically conductive adhesive 5 into gaps formed therebetween, an excellent adhesive strength (antistripping strength) is obtained. Accordingly, the ratio of frequency drift after the drop test to the frequency before the drop test can be reduced.

Further, it is preferable to apply the electrically conductive adhesive 5 to both the quartz plate 9 and the quartz plate fixture mount comprising the electrode pad 34 and the non-pad portions 16 so that both are adhered to each other, reinforcing the adhesive strength still further.

Figure 11:
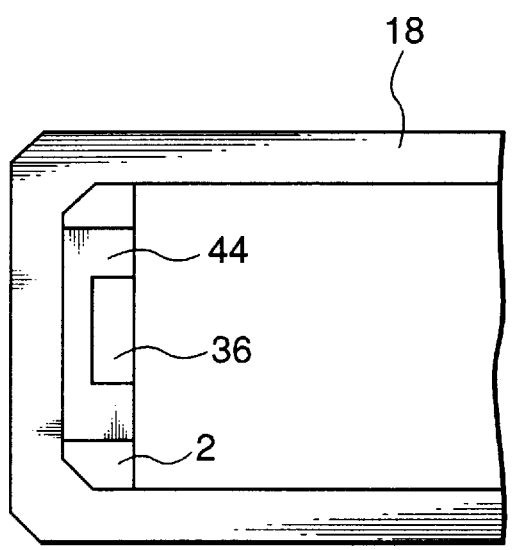
FIG. 11 is a partial plan view, similar to FIG. 10, illustrating an example of a square-shaped non-pad portion formed on one edge of the respective electrode pads.

FIG. 11 is a plan view, similar to FIG. 10, showing an example of an electrode pad formed in a different shape.

An electrode pad 44 is provided with a square-shaped non-pad portion 36 formed substantially in the center of the electrode pad 44 along one edge thereof. The non-pad portion 36 is formed by exposing the second substrate 2, and composed of ceramic material.

The non-pad portion 36 is disposed substantially in the center of the electrode pad 34 along the right side edge thereof, however, the same may be formed on the left side edge thereof.

In this embodiment as in the case of the surface mounting crystal unit described with reference to FIG. 10, the quartz plate 9 (as referred to in FIG. 1) is bonded to the electrode pad 44 and the non-pad portion 36 after adhering the electrically conductive adhesive 5 to both the electrode pad 44 and the non-pad portion 36.

Figure 12:
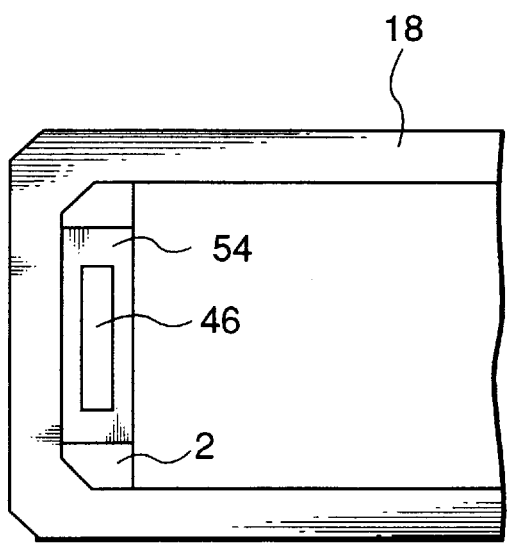
FIG. 12 is a partial plan view, similar to FIG. 10, illustrating an example of a square-shaped non-pad portion formed in the middle part of the respective electrode pads.

FIG. 12 is a plan view, similar to FIG. 10, showing an example of an electrode pad formed in another different shape.

An electrode pad 54 is provided with a square-shaped non-pad portion 46 in the middle thereof. The non-pad portion 46 may be formed in a shape other than a square as illustrated in the figure, for example, a circle, and the like, or a plurality thereof.

Figure 13:
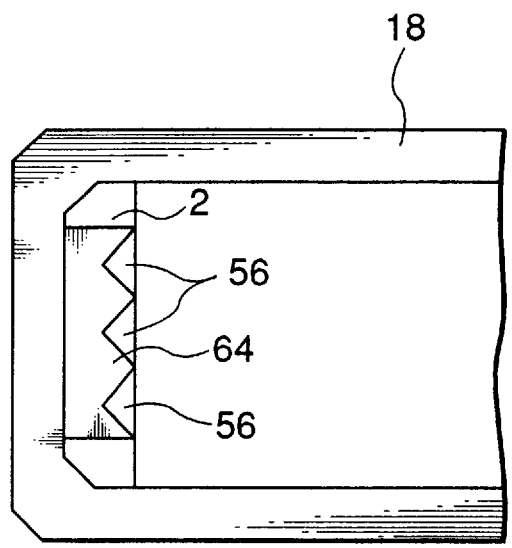
FIG. 13 is a partial plan view, similar to FIG. 10, illustrating an example of a plurality of triangle-shaped non-pad portions formed on one edge of the respective electrode pads.

FIG. 13 is a plan view, similar to FIG. 10, showing an embodiment wherein a plurality of non-pad portions formed in a further different shape are provided.

In this embodiment, an electrode pad 64 is provided with a plurality of non-pad portions 56, each formed in the shape of a triangle, on one edge thereof. This embodiment still has the same effect of operation as that of the respective embodiments described with reference to FIGS. 10 to 12.

Figure 14:
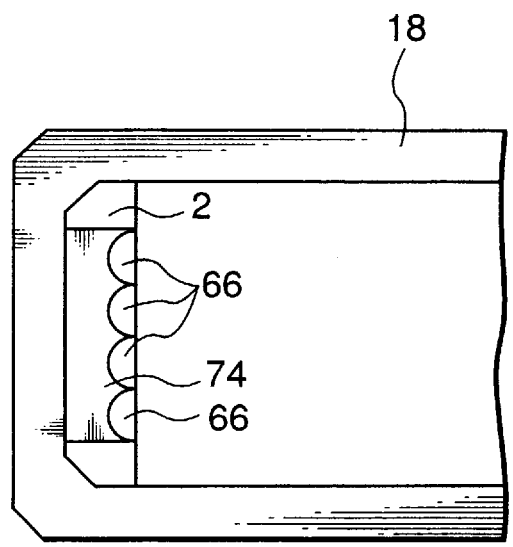
FIG. 14 is a partial plan view, similar to FIG. 10, illustrating an example of a plurality of semicircle-shaped non-pad portions formed on one edge of the respective electrode pads.

FIG. 14 is a plan view, similar to FIG. 10, showing an embodiment wherein a plurality of non-pad portions each formed in a still further different shape are provided.

In this embodiment, an electrode pad 74 is provided with a plurality of non-pad portions 66, each formed in the shape of a semicircle, on one edge thereof. This embodiment also has the same effect of operation as that of the respective embodiments described with reference to FIGS. 10 to 13. The shape of each of the non-pad portions 66 need not be limited to a semicircle, but may be a full circle or an ellipse.

With reference to FIGS. 10 to 14, examples of the electrode pads and the non-pad portions in various shapes are described as above. However, the plurality of the non-pad portions in the respective embodiments may not be of an identical shape, but may be of combination of various shapes instead.

In whichever shape the electrode pad and the non-pad portions are formed, the electrically conductive adhesive 5 is adhered to both the electrode pad and the non-pad portions. Also, the total area of the electrode pads and the same of the non-pad portions may be preferably formed in the ratio of 1:1.

Figure 15:
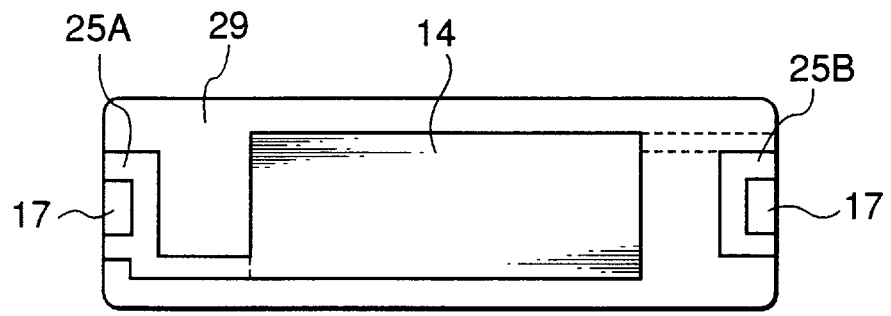
FIG. 15 is a plan view illustrating an example of a quartz plate provided in the surface mounting crystal unit according to the invention.
Figure 16:
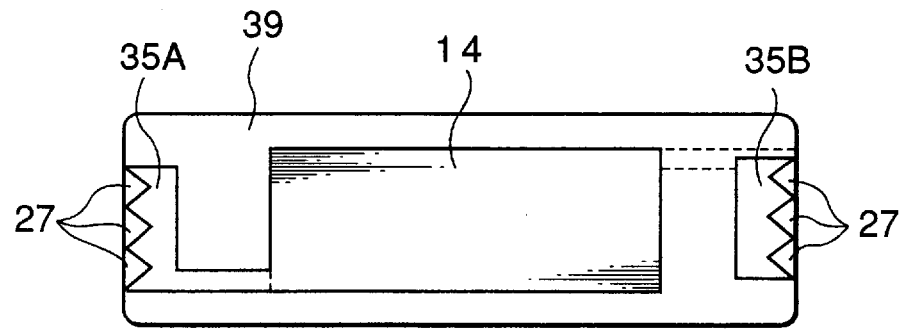
FIG. 16 is a plan view, similar to FIG. 15, illustrating an example of a variation of the quartz plate.
Figure 17:
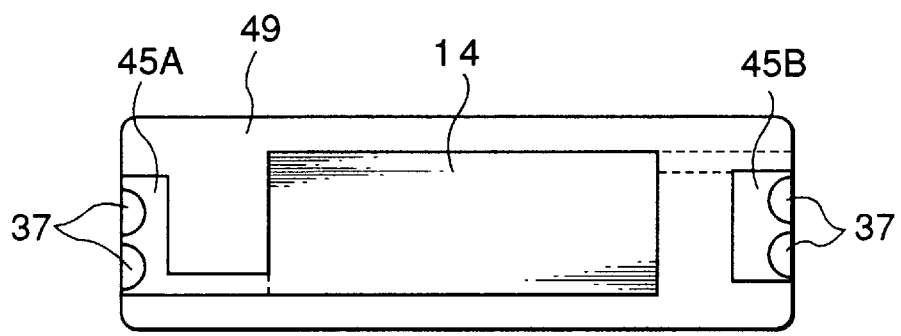
FIG. 17 is a plan view, similar to FIG. 15, illustrating an example of another variation of the quartz plate.

[Examples of Various Types of Quartz Plates Provided With Variously-shaped Edge Electrodes: FIGS. 15 to 17]

With reference to FIGS. 15 to 17, embodiments of various types of quartz plates securely held at both ends thereof are described hereafter.

A quartz plate 29 shown in FIG. 15 is provided with excitation electrodes 14 composed of a metal, for example, gold, palladium, silver, or the like, and formed on both faces of the quartz plate 29. Edge electrodes 25A and 25B are formed along the shorter sides of the quartz electrode 29 at both the left and right ends thereof as seen in the figure. The edge electrodes 25A and 25B are provided with a square-shaped non-electrode portion 17, respectively, formed along the respective external edges of the quartz plate 29 by exposing parts thereof.

FIG. 15 shows an example wherein the edge electrodes 25A and 25B are provided with a single non-electrode portion 17, respectively, however, a plurality of the non-electrode portions 17 may be provided on the edge electrodes 25A and 25B, respectively.

In case of the electrically conductive adhesive 5 being a silicone-based adhesive, the excitation electrodes 14, normally composed of gold, palladium, silver, or the like, have a low adhesive strength against silicone.

However, since the edge electrodes 25A and 25B are provided with the non-electrode portion 17, respectively, formed in a region where the quartz plate 29 is securely held by the terminal member, and the quartz plate 29 is bonded to the terminal member with the electrically conductive adhesive 5 being adhered additionally to the non-electrode portions 17 where the quartz plate 29 is exposed, a high adhesive strength is obtained.

FIG. 16 is a plan view showing an embodiment of the quartz plate provided with differently shaped edge electrodes and non-electrode portions.

A quartz plate 39 is also provided with the excitation electrodes 14 formed on both faces thereof, and edge electrodes 35A and 35B formed along the shorter sides at the left and right ends of the quartz plate 39 in the figure, respectively. The edge electrodes 35A and 35B are provided with a plurality of non-electrode portions 27, respectively, each in the shape of a triangle formed successively to each other, on the respective external edges of the quartz plate 39.

The quartz plate fabricated as above attains the same effect of operation as that of the embodiment illustrated in FIG. 15.

FIG. 17 is a plan view, similar to FIG. 15, showing an embodiment of the quartz plate provided with edge electrodes and non-electrode portions formed in further different shapes.

The quartz plate 49 is also provided with the excitation electrodes 14 on both faces thereof and edge electrodes 45A and 45B formed along the shorter sides at the left and right ends of the quartz plate 49, respectively. The edge electrodes 45A and 45B are provided with a plurality of non-electrode portions 37, respectively, each substantially in the shape of a semi-circle, on the respective external edges of the quartz plate 49.

The non-electrode portion 37 may be formed in the shape of a full circle or an ellipse.

The quartz plate 49 fabricated as above still has the same effect of operation as that of the embodiment illustrated in FIG. 15.

Further, the plurality of the non-pad portions 27 and 37 formed, respectively, need not be of an identical shape, but may be of combination of various shapes instead.

In whichever shapes the edge electrodes and the non-electrode portions are formed, the electrically conductive adhesive 5 is adhered to both the respective edge electrodes and the respective non-electrode portions. Also, the total area of the edge electrodes and the same of the non-electrode portions may be preferably formed in the ratio of 1:1.

Further, the non-electrode portions 27 in FIG. 16, and the non-electrode portions 37 in FIG. 17 may be formed on the left and right edge of the respective edge electrodes, alternately, and spaced apart as in the case of the non-pad portions 16 illustrated in FIG. 10.

Referring to FIGS. 10 to 14, the various shapes of the electrode pads provided on the second substrate 2 of the terminal member 20, and referring to FIGS. 15 to 17, the various shapes of the edge electrodes provided on the quartz plate are illustrated hereinabove. The adhesive strength of the quartz plate bonded onto the second substrate 2 is enhanced by forming both the electrode pads and the edge electrodes, to be fixedly attached to the electrode pads, in various shapes, respectively, as described in the foregoing.

Accordingly, at a drop test conducted on the surface mounting crystal unit, the ratio of frequency drift to the frequency before the drop test can be lowered.

In the case of the surface mounting crystal unit according to the respective embodiments of the invention as described with reference to FIGS. 1 and 7, the lid 8 is bonded airtightly to the airtight sealant 18 with the solder 11. However, such airtight bonding may be effected by means of the seam welding on the condition described hereafter.

A vacuum is produced inside the terminal member 20 as shown in FIG. 1, and when the electrically conductive adhesive 5 of high plasticity is used and the quartz plate 9 is securely held at both ends thereof, the quartz plate is disposed such that the crystallographic axes thereof are oriented as shown in FIG. 4, or when the quartz plate 19 is fixedly held in a cantilever fashion, the crystallographic axes thereof are oriented as shown in FIG. 9.

Then even if the evolution of gas occurs due to sparks produced hen the seam welding is applied to the lid 8 for vacuum sealing, the lid 8 is airtightly bonded while the gas is drawn off outside the terminal member 20 or 20' at lower pressures. Consequently, there is hardly any amount of gas left in the terminal member 20 and 20' serving as receptacles, thus attaining stability in frequency.

Figure 18:
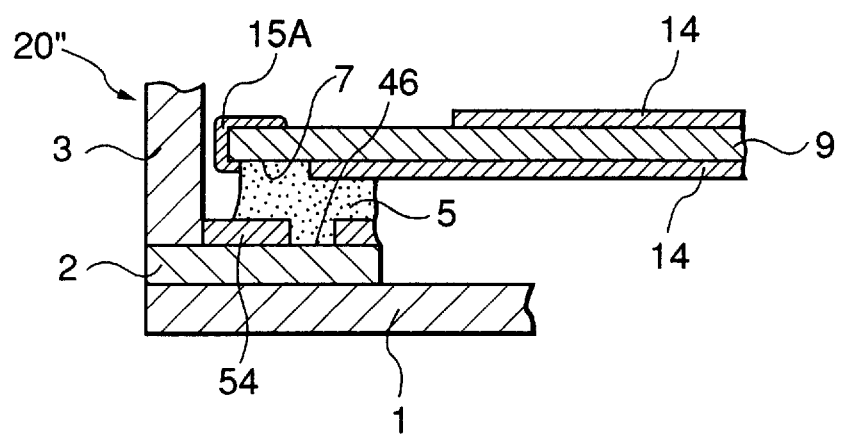
FIG. 18 is a longitudinal sectional view illustrating an example of the surface mounting crystal unit fabricated by combining a quartz plate having semicircle-shaped non-electrode portions with the terminal member provided with the electrode pads having square-shaped non-pad portions.

FIG. 18 is a longitudinal sectional view showing an example of a surface mounting crystal unit fabricated by combining the terminal member provided with the electrode pads having square-shaped non-pad portions with the quartz plate having non-electrode portions, each formed in the shape of a semicircle, and in the figure, parts corresponding to the same in FIG. 1 are designated with the identical reference numerals.

In this surface mounting crystal unit, a terminal member 20" provided with electrode pads 54 as illustrated in FIG. 12 is combined with the quartz plate 9 as illustrated in FIG. 4.

Specifically, the electrode pads 54 and the non-pad portions 46 are provided on the second substrate 2, and the quartz plate 9 is provided with the edge electrodes 15A and 15B, and the non-electrode portions 7 and 7, each formed in the shape of a semicircle, respectively, at the opposite longitudinal ends of the quartz plate. The non-electrode portions 7 are regions where the quartz plate 9 is exposed.

FIG. 18 shows the electrode pad 54 and the non-pad portion 46 on the left hand only as seen in the figure, but the same are also formed on the right hand in the figure.

As in the case of the electrode pads 4 illustrated in FIGS. 1 and 2, the electrode pads 54 are formed by sintering tungsten or molybdenum powders, and the surfaces thereof are plated with nickel. The nickel coating thus formed is further plated with gold.

The silicone-based electrically conductive adhesive 5 of high plasticity is adhered to both the electrode pads 54 and the non-pad portions 46 at the opposite ends of the terminal member, and the edge electrodes 15A and 15B (FIG. 4) and the non-electrode portions 7 and 7 at the opposite ends of the quartz plate, which are then bonded to each other for electrical connection. Also, the respective excitation electrodes 14 are electrically connected to the respective electrode pads 54.

Thus, the electrically conductive adhesive 5 is directly adhered to both the electrode pads 54 at both ends, and the edge electrodes 15A and 15B, respectively. Also, the electrically conductive adhesive 5 is directly adhered to the non-electrode portions 7 formed at the opposite ends of the quartz plate 9, respectively.

As described in the foregoing, this surface mounting crystal unit is so structured that the quartz plate 9 is fixedly attached to the second substrate 2 of the terminal member 20" by direct bonding therebetween with the electrically conductive adhesive 5.

Consequently, even though silicone in the electrically conductive adhesive 5 has normally a low bonding strength against gold because the surface of the respective electrode pads 54, plated with gold as described in the foregoing, is flat and smooth, the bonding strength of the electrically conductive adhesive 5 can be enhanced by bonding additionally to the non-pad portions 46 where ceramic is exposed.

More specifically, a bonding strength (adhesive strength) is higher between silicone and ceramic than the same between silicone and gold, and furthermore, as there are numerous protrusions and depressions on the surface of ceramic parts and bonding is effected by the ingress of the electrically conductive adhesive 5 into gaps formed therebetween, the adhesive strength in this case is increased.

In this surface mounting crystal unit constructed such that the quartz plate 9 is fixedly attached to the second substrate 2 of the terminal member 20", composed of a ceramic substrate, by bonding directly to the non-pad portions 46 as well with the electrically conductive adhesive 5, the adhesive strength of the quartz plate 9 against the terminal member 20" is enhanced. Consequently, a securely holding strength of the terminal member 20" for the quartz plate 9 is increased, resulting in a significant improvement of the impact-resistant property of the crystal unit.

Further, an adhesive strength between the quartz plate 9 and the electrically conductive adhesive 5 is not high when a silicone-based adhesive is used for the electrically conductive adhesive 5 since the excitation electrodes 14 are normally made of gold (Au), palladium (Pd), or silver (Ag).

However, an adhesion strength of silicone against the surface of the quartz plate 9 in the non-electrode portions 7 is higher than the same against the aforesaid metals used for the excitation electrodes 14.

Further, the silicone-based electrically conductive adhesive 5 does not give rise to any trouble with respect to electrical connection even though its adhesive strength against metals is not satisfactory. Accordingly, by applying the electrically conductive adhesive 5 to both the quartz plate 9 and the second substrate 2 made of ceramic, direct bonding of the quartz plate 9 to the second substrate 2 is effected, improving significantly the fixedly holding strength of the second substrate 2 against the quartz plate 9.

Now, referring to FIG. 22, the results of drop tests conducted on the surface mounting crystal unit according to this embodiment show that even when the surface mounting crystal unit was allowed to free fall from a height of 1.5 meters onto a concrete surface, the ratio of frequency drift to the frequency before the test was found to remain within plus or minus 1 ppm as required by the specification as indicated by the lengths of blank bars G in the bar graph showing the results of drop tests conducted twenty times.

Figure 19:
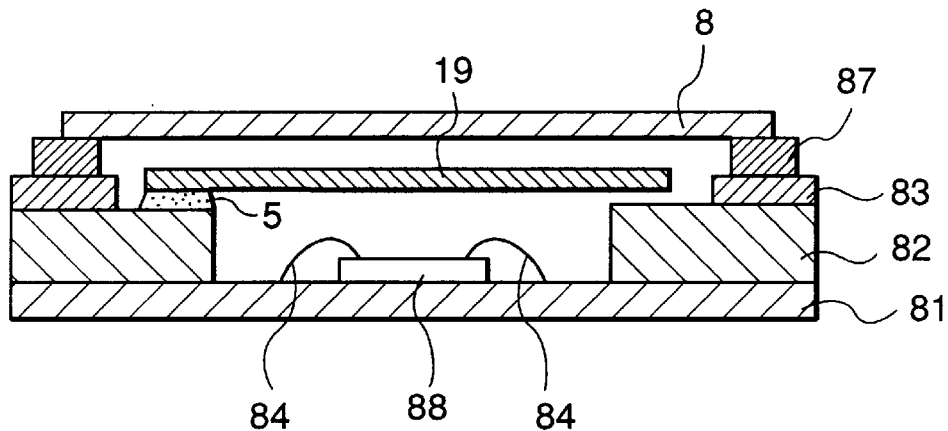
FIG. 19 is a longitudinal sectional view of a crystal unit illustrating an example of another application of the invention.

FIG. 19 is a longitudinal sectional view of a crystal unit illustrating an example of other application of the invention.

The crystal unit is composed of multi-layered substrates made of ceramic, 81, 82, and 83, and a semiconductor chip 88 is provided on the top of the substrate 81.

Lead wires 84 and 84 are connected to the semiconductor chip 88. A quartz plate 19 is disposed over the semiconductor chip 88, and fixedly attached to the substrate 82 by bonding one end of the quartz plate 19 thereto with use of the electrically conductive adhesive 5.

Further, a seam ring 87 is fixedly attached to the surface of the substrate 83, and the lid 8 is airtightly bonded to the seam ring 87. Thus, the quartz plate 19 of the crystal unit is fixedly attached to the multi-layered substrates in the same fashion as in the case of the surface mounting crystal unit illustrated in FIG. 7. The crystal unit constructed as above has a largely improved impact-resistant property.

Finally, effects of the invention are summarized hereunder.

With the surface mounting crystal unit according to the invention, the magnitude of frequency drift with time is reduced, and any minuscule leakage at airtightly bonded interfaces is detected from a change in the crystal impedance by keeping the inside of a terminal member bonded airtightly to the lid in a vacuum, thereby enabling judgment with certainty on product quality at an early stage immediately after production. Furthermore, the crystal oscillator can have a small negative resistance because of low crystal impedance due to the inside of the terminal member being in a vacuum condition.

In addition, in the surface mounting crystal unit, the quartz plate is fixedly attached to the flat surface parts of the terminal member by the use of an electrically conductive adhesive of high plasticity, and consequently, a drop-impact resistant property thereof is significantly improved. Accordingly, there is no need for providing means of absorbing the impact of a drop by securing the quartz plate to a support board made of a metal as was the case with the conventional surface mounting crystal unit. Therefore, the size thereof can be reduced since the total thickness is reduced to an extent that the support board is dispensed with.

What is claimed is:

1. A surface mounting crystal unit comprising:

a quartz plate;

a terminal member resembling a receptacle and holding the quartz plate inserted from an opening thereof so as to be able to oscillate the quartz plate therein, said terminal member having quartz plate fixture mounts, one of said quartz plate fixture mounts disposed on each of two ends of said terminal member, said quartz plate fixture mounts having electrode pads; and a lid covering the opening of the terminal member, said quartz plate being formed in the shape of a rectangular parallelepiped by cutting in the direction of an AT cut relative to a crystallographic axis and disposed such that one or both of shorter sides thereof at the opposite longitudinal ends are fixedly attached on one or both of quartz plate fixture mounts in said terminal member by use of one of a silicone-based, urethane-based, or polymide-based electrically conductive adhesive of high plasticity, said electrode pads being provided with non-pad portions each formed in the shape of a square or circle in the middle part or on the edge thereof so that the quartz plate is fixedly attached to one or both of the quartz plate fixture mounts by adhering said electrically conductive adhesive to both the electrode pads and the non-pad portions, and said lid being airtighly bonded to the opening of the terminal member with use of a solder composed of one of an alloy made of gold and tin, an alloy made of lead, silver, and tin, or an alloy made of lead and tin, the terminal member airtightly sealed being vacuumized.

2. A surface mounting crystal unit according to claim 1, wherein said quartz plate is disposed such that longer sides of said rectangular parallelepiped run in parallel with a Z' axis while the shorter sides thereof are in parallel with a X axis crossing the Z' axis at right angles, and wherein both of the shorter sides of the quartz plate are fixedly attached on both of the quartz plate fixture mounts of said terminal member.

3. A surface mounting crystal unit according to claim 1, wherein said quartz plate is disposed such that longer sides of said rectangular parallelepiped run in parallel with a X axis while the shorter sides thereof are in parallel with a Z' axis crossing the X axis at right angles, and wherein one of the shorter sides of the quartz plate are fixed attached on one of the quartz plate fixture mounts of said terminal member.

4. A surface mounting crystal unit according to claim 1 wherein the quartz plate is fixedly attached to the quartz plate fixture mounts with the electrically conductive adhesive adhered to both the quartz plate and the quartz plate fixture mounts.

5. A surface mounting crystal unit according to claim 1, wherein the lid is made of a base material such as a metal, a ceramic, a glass ceramic, or a glass, and surface treatment films are formed on both faces of the base material, and wherein the surface treatment films are comprised a nickel plating on the base material and one of a gold plating, a palladium plating, or a nickel-palladium alloy plating on the nickel plating.

6. The surface mounting crystal unit according to claim 1 wherein the lid is made of a base material such as a metal, a ceramic, a glass ceramic, or a glass, and surface treatment films are formed on both faces of the base material, and wherein the surface treatment films are comprised of a nickel plating on the base material, a nickel-palladium alloy plating on the nickel plating, and a palladium plating or gold plating on the nickel-palladium alloy plating.

7. A surface mounting crystal unit comprising:

a quartz plate;

a terminal member resembling a receptacle and holding the quartz plate inserted from an opening thereof so as to be able to oscillate the quartz plate therein, said terminal member having quartz plate fixture mounts, one of said quartz plate fixture mounts disposed on each of two ends of said terminal member, said quartz plate fixture mounts having electrode pads; and a lid covering the opening of the terminal member, said quartz plate being formed in the shape of a rectangular parallelepiped by cutting in the direction of an AT cut relative to a crystallographic axis and disposed such that one or both of shorter sides thereof at the opposite longitudinal ends are fixedly attached on one or both of the quartz plate fixture mounts in said terminal member by use of one of a silicone-based, urethane-based, or polymide-based electrically conductive adhesive of high plasticity, said quartz plate having electrodes formed in regions where the quartz plate is fixedly attached to the electrode pads of one or both of the quartz plate fixture mounts, said electrodes being provided with non-electrode portions each formed in the shape of a square or circle in the middle part or on the edge thereof so that the quartz plate is fixedly attached to one or both of the quartz plate fixture mounts by adhering said electrically conductive adhesive between the quartz plate and the quartz plate fixture mounts, at both of said electrodes and the non-electrode portions, and said lid being airtightly bonded to the opening of the terminal member with use of a solder composed of one of an alloy made of gold and tin, an alloy made of lead, silver, and tin, or an alloy made of lead and tin, the terminal member airtighly sealed being vacuumized.

8. A surface mounting crystal unit according to claim 7, wherein said quartz plate is disposed such that longer sides of said rectangular parallelepiped run in parallel with a Z' axis while the shorter sides thereof are in parallel with a X axis crossing the Z' axis at right angles, and wherein both of the shorter sides of the quartz plate are fixed attached on both of the quartz plate fixture mounts of said terminal member.

9. A surface mounting crystal unit according to claim 7, wherein said quartz plate is disposed such that longer sides of said rectangular parallelepiped run in parallel with a X axis while the shorter sides thereof are in parallel with a Z' axis crossing the X axis at right angles, and wherein one of the shorter sides of the quartz plate are fixed attached on one of the quartz plate fixture mounts of said terminal member.

10. The surface mounting crystal unit according to claim 7, wherein the lid is made of a base material such as a metal, a ceramic, a glass ceramic, or a glass, and surface treatment films are formed on both faces of the base material, and wherein the surface treatment films are comprised of a nickel plating on the base material and one of a gold plating, a palladium plating, or a nickel-palladium alloy plating.

11. The surface mounting crystal unit according to claim 7 wherein the lid is made of a base material such as a metal, a ceramic, a glass ceramic, or a glass, and surface treatment films are formed on both faces of the base material, and wherein the surface treatment films are comprised of a nickel plating on the base material, a nickel-palladium alloy plating on the nickel plating, and a palladium plating or gold plating on the nickel-palladium alloy plating.

* * * * *